US010050067B2

(12) United States Patent
Seo et al.

(10) Patent No.: US 10,050,067 B2
(45) Date of Patent: Aug. 14, 2018

(54) LASER CRYSTALLIZATION APPARATUS AND METHOD OF DRIVING THE SAME

(71) Applicant: Samsung Display Co., Ltd, Yongin-si, Gyeonggi-do (KR)

(72) Inventors: Jong-Oh Seo, Seoul (KR); Dong-Min Lee, Yongin-si (KR); Mee-Jae Kang, Suwon-si (KR); Sang-Ho Jeon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/442,407

(22) Filed: Feb. 24, 2017

(65) Prior Publication Data

US 2018/0012914 A1    Jan. 11, 2018

(30) Foreign Application Priority Data

Jul. 5, 2016    (KR) ........................ 10-2016-0084706

(51) Int. Cl.
*H01L 27/12*    (2006.01)
*G02B 27/09*    (2006.01)

(52) U.S. Cl.
CPC ...... *H01L 27/1285* (2013.01); *G02B 27/0927* (2013.01); *G02B 27/0955* (2013.01); *H01L 27/1222* (2013.01)

(58) Field of Classification Search
CPC ............ H01L 27/1285; H01L 27/1222; G02B 27/0927; G02B 27/0955
See application file for complete search history.

(56) References Cited

U.S. PATENT DOCUMENTS

| | | | | |
|---|---|---|---|---|
| 6,524,977 | B1 * | 2/2003 | Yamazaki | ............ B23K 26/073 250/492.2 |
| 6,602,744 | B1 * | 8/2003 | Ino | ...................... H01L 21/2026 257/E21.134 |
| 2002/0025096 | A1 * | 2/2002 | Wang | ..................... G02B 27/09 385/8 |

FOREIGN PATENT DOCUMENTS

| | | |
|---|---|---|
| JP | 4453112 B2 | 2/2010 |
| KR | 10-2010-0017954 A | 2/2010 |
| KR | 10-2012-0048239 A | 5/2012 |
| KR | 10-2015-0065391 A | 6/2015 |

* cited by examiner

*Primary Examiner* — Kyoung Lee
(74) *Attorney, Agent, or Firm* — Innovation Counsel LLP

(57) ABSTRACT

A laser crystallization apparatus includes a laser generating module configured to generate a laser beam, an optical module configured to guide the laser beam, an annealing chamber comprising a stage on which a target substrate comprising an amorphous thin film formed therein is disposed, the stage being movable along an X-axis direction and a Y-axis direction, and a tilt refractive lens configured to transform the laser beam having a cross-sectional area of a rectangle shape into a tilted laser beam having a cross-sectional area of a non-rectangular parallelogram shape and to irradiate the tilted laser beam perpendicular to the stage.

20 Claims, 8 Drawing Sheets

LASER CRYSTALLIZATION APPARATUS AND METHOD OF DRIVING THE SAME

This application claims priority from and the benefit of Korean Patent Application No. 10-2016-0084706 filed on Jul. 5, 2016, which is hereby incorporated by reference for all purposes as if fully set forth herein.

BACKGROUND

1. Field

Exemplary embodiments of the inventive concept relate to a laser crystallization apparatus and a method of driving the laser crystallization apparatus. More particularly, example embodiments of the inventive concept relate to a laser crystallization apparatus for reducing crystallization defects and a method of driving the laser crystallization apparatus.

2. Description of the Related Art

Generally, amorphous silicon has a drawback in that it has low electron mobility, i.e. low charge carrier mobility. Polycrystalline silicon can be used in a driving circuit including a thin film transistor (TFT) on a substrate, which is not possible with amorphous silicon. Therefore, TFTs that are manufactured with polycrystalline silicon do not need a plurality of terminal connections and a driver integrated circuit (IC). Thus, productivity and reliability can be improved and the thickness of a display panel may be reduced when using polycrystalline silicon TFTs.

Methods of manufacturing such polycrystalline silicon TFTs at a low temperature include solid phase crystallization (SPC), metal induced crystallization (MIC), metal induced Lateral Crystallization (MILC), metal induced lateral crystallization (MILC) and excimer laser annealing (ELA). Particularly, when manufacturing an original light-emitting diode (OLED) display or a liquid crystal display (LCD), the excimer laser annealing method is typically used and includes using a high energy laser beam to perform crystallization.

BRIEF SUMMARY

Exemplary embodiments of the inventive concept provide a laser crystallization apparatus for reducing crystallization defects.

Exemplary embodiments of the inventive concept provide a method of driving the laser crystallization apparatus.

According to an exemplary embodiment of the inventive concept, there is provided a laser crystallization apparatus. The laser crystallization apparatus includes a laser generating module configured to generate a laser beam, an optical module configured to guide the laser beam, an annealing chamber comprising a stage on which a target substrate comprising an amorphous thin film formed therein is disposed, the stage being movable along an X-axis direction and a Y-axis direction, and a tilt refractive lens configured to transform the laser beam having a cross-sectional area of a rectangle shape into a tilted laser beam having a cross-sectional area of a non-rectangular parallelogram shape and to irradiate the tilted laser beam perpendicular to the stage.

In an exemplary embodiment, the stage may move along only the X-axis direction.

In an exemplary embodiment, the cross-sectional area of the tilted laser beam may include the non-rectangular parallelogram shape which has a shorter-side being parallel with the X-axis and a tilted longer-side tilted with respect to the Y-axis.

In an exemplary embodiment, the optical module may include a plurality of reflection mirrors configured to reflect the laser beam toward the annealing chamber and a first window configured to transmit the laser beam reflected from the reflection mirrors toward the annealing chamber, wherein the first window comprises the tilt refractive lens.

In an exemplary embodiment, the annealing chamber may include a second window configured to transmit the laser beam exited from the optical module toward the stage, wherein the second window comprises the tilt refractive lens.

In an exemplary embodiment, the annealing chamber may include a second window configured to transmit the laser beam exited from the optical module and a reflection mirror configured to reflect the laser beam incident through the second window toward the tilt refractive lens.

In an exemplary embodiment, a shot area of the target substrate in which the tilted laser beam is shot, may partially overlap with a previous shot area of the target substrate on which a tilted laser beam is previously shot.

In an exemplary embodiment, a scan area of the target substrate in which the tilted laser beam scans may include a first side edge parallel with the X-axis and a second side edge being tilted with respect to the Y-axis.

In an exemplary embodiment, the scan area may have a non-rectangular parallelogram shape which is tilted with respect to the Y-axis.

In an exemplary embodiment, the laser beam may be a pulsed laser.

In an exemplary embodiment, the target substrate may include a TFT array substrate for a display apparatus.

According to an exemplary embodiment of the inventive concept, there is provided a method of driving a laser crystallization apparatus. The method includes generating a laser beam, transforming the laser beam having a cross-sectional area of a rectangle shape into a tilted laser beam having a cross-sectional area of a non-rectangular parallelogram shape and irradiating the tilted laser beam perpendicular to a target substrate which comprises an amorphous thin film formed therein and is disposed on a stage.

In an exemplary embodiment, the stage may move along only the X-axis direction.

In an exemplary embodiment, the cross-sectional area of the tilted laser beam may include the non-rectangular parallelogram shape which has a shorter-side being parallel with the X-axis and a tilted longer-side tilted with respect to the Y-axis.

In an exemplary embodiment, the cross-sectional area of the tilted laser beam may include a longer-side tilted by an angle of −1 degree with respect to the Y-axis.

In an exemplary embodiment, a shot area of the target substrate in which the tilted laser beam is shot, may partially overlap with a previous shot area of the target substrate on which the tilted laser beam is previously shot.

In an exemplary embodiment, a scan area of the target substrate in which the tilted laser beam scans the target substrate may include a first side edge being parallel with the X-axis and a second side edge being tilted with respect to the Y-axis.

In an exemplary embodiment, the scan area may have a non-rectangular parallelogram shape which is tilted with respect to the Y-axis.

In an exemplary embodiment, the target substrate may include a TFT array substrate for a display apparatus.

In an exemplary embodiment, the laser beam may be a pulsed laser.

According to an exemplary embodiment of the inventive concept, the laser crystallization apparatus may irradiate the tilted laser beam having the cross-sectional area of a non-rectangular parallelogram shape perpendicular to a surface of the stage and then move the stage along only one direction without a tilt.

Therefore, the stage is moved along only the X-axis direction and thus, the stage ripple may be reduced. In addition, the tilted laser beam having the cross-sectional area of the non-rectangular parallelogram shape is irradiated perpendicular to the target substrate and thus, a space between side edges of the scan area and the target substrate corresponding to each other may be the same from a beginning portion to an end portion of the scan area. Thus, a non-crystallization area in the target substrate may be eliminated.

BRIEF DESRCIPTION OF THE DRAWINGS

The above and other features of the inventive concept will become more apparent by describing in detailed exemplary embodiments thereof with reference to the accompanying drawings, in which.

DETAILED DESRCIPTION

Hereinafter, the inventive concept will be explained in detail with reference to the accompanying drawings.

Figure 1:
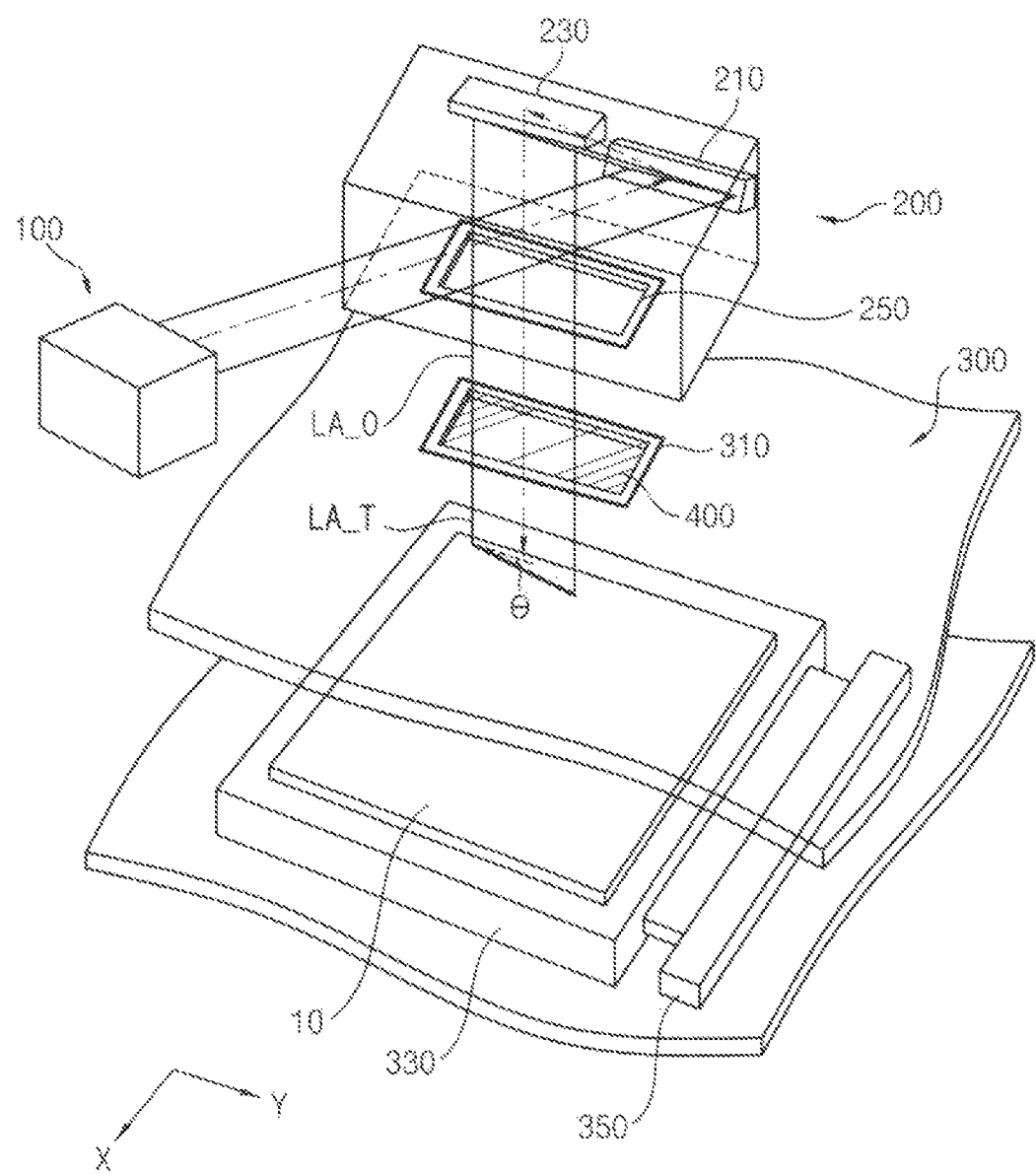
FIG. 1 is a perspective view illustrating a laser crystallization apparatus according to an exemplary embodiment.
Figure 2:
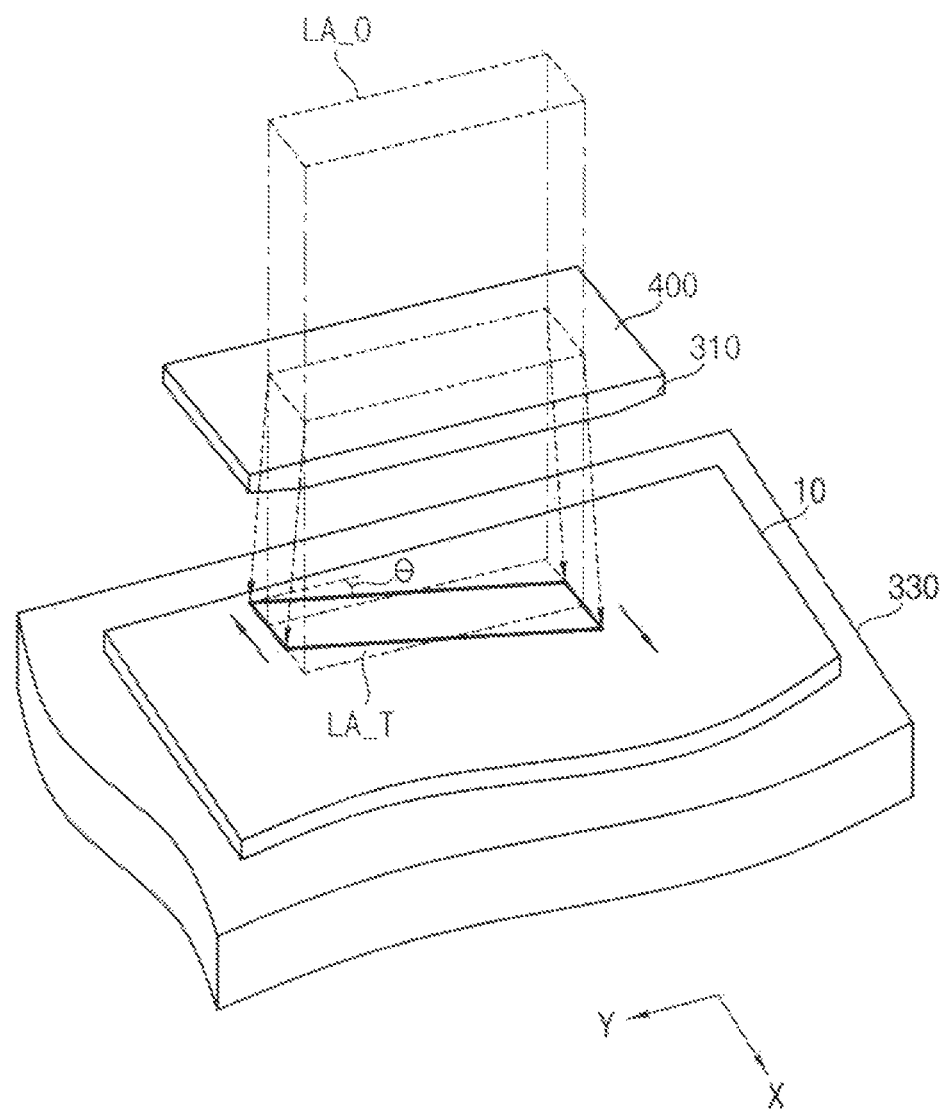
FIG. 2 is a conceptual diagram illustrating a laser crystallization apparatus according to an exemplary embodiment.

FIG. 1 is a perspective view illustrating a laser crystallization apparatus according to an exemplary embodiment. FIG. 2 is a conceptual diagram illustrating a laser crystallization apparatus according to an exemplary embodiment.

Referring to FIG. 1, the laser crystallization apparatus may include a laser generating module 100, an optical module 200 and an annealing chamber 300.

The laser generating module 100 is configured to generate a laser beam. The laser beam may be a pulsed laser. The laser beam LA_O generated from the laser generating module 100 may have a line shape and a cross-sectional area of the laser beam LA_O may have a rectangle shape.

The laser beam LA_O which is an excimer laser beam may be used to crystallize an amorphous silicon layer which is an amorphous thin film formed on a target substrate 10 into a polycrystalline silicon layer. The amorphous thin film may comprise an amorphous silicon layer and may be formed by a low pressure chemical vapor deposition method, an atmosphere chemical vapor deposition method, a plasma enhanced chemical vapor deposition method (PECVD), a sputtering method and a vacuum evaporation method, etc.

The optical module 200 may be configured to guide a path of the laser beam and comprise a first reflection mirror 210, a second reflection mirror 230 and a first window 250.

The first reflection mirror 210 is configured to reflect the laser beam LA_O toward the second reflection mirror 230. The first reflection mirror 210 may reflect at an exit angle larger than an incident angle of the laser beam LA_O.

The second reflection mirror 230 is configured to reflect the laser beam LA_O toward the annealing chamber 300.

The first window 250 may be disposed in the optical module 200. The laser beam LA_O generated from the optical module 200 may be transmitted toward the annealing chamber 300 through the first window 250.

The annealing chamber 300 may include a second window 310, a stage 330 and a stage driver 350.

The second window 310 may be disposed in the annealing chamber 300. The laser beam LA_O exited from the optical module 200 may be transmitted into the annealing chamber 300 through the second window 310.

Referring to FIG. 2, the second window 310 may be coated with a material having a tilt refractive index or may have a tilt refractive lens 400 which is adhered to a film having the tilt refractive index. The tilt refractive lens 400 is configured to transform the laser beam LA_O having a cross-sectional area of a rectangle shape into a tilted laser beam LA_T having a cross-sectional area of a non-rectangular parallelogram shape which has a longer-side tilted by a predetermined angle.

For example, the tilt refractive lens 400 is configured to have enter the laser beam LA_O having the cross-sectional area of the rectangle shape which includes a longer-side parallel with a Y-axis and a shorter-side parallel with an X-axis and is configured to have exit a tilted laser beam LAT having the cross-sectional area of a non-rectangular parallelogram shape which includes a longer-side tilted by a predetermined angle θ with respect to the Y-axis and a shorter-side parallel with an X-axis. The predetermined angle θ may be an angle of about −1 degree. Alternatively, the predetermined angle θ may be variously preset according to process conditions.

The tilted laser beam LA_T may be irradiated perpendicular to a surface of the stage 330.

The target substrate 10 having a target thin film which is an amorphous thin film is mounted on the surface of the stage 330.

The stage driver 350 is configured to move the stage 330 on the X-axis and the Y-axis according to the process conditions and beside, is configured to rotate with respect to the X-axis or the Y-axis.

According to the exemplary embodiment, the stage driver 350 is configured to move the stage 330 along only one direction, for example, the X-axis direction. The tilted laser beam LA_T may be irradiated perpendicular to a surface of the stage 330 and scan the target substrate 10 mounted on the surface of the stage 330 along the X-axis direction.

Crystallization processes of the laser crystallization apparatus according to the exemplary embodiment includes generating the tilted laser beam having the cross-sectional area of the non-rectangular parallelogram shape, irradiating the tilted laser beam perpendicular to the surface of the stage 330 on which the target substrate 10 is mounted, and moving the stage 330 along only one direction.

Thus, the stage may move in only one direction and thus, a ripple of the stage may be reduced. In addition, the tilted laser beam having the cross-sectional area of the non-rectangular parallelogram shape is irradiated perpendicular to the target substrate and scans the target substrate along only one direction. Thus, a space between side edges of the scan area and the target substrate corresponding to each other may be the same from a beginning portion SP to an end portion EP of the scan area (see FIG. 4). Thus, a non-crystallization area in the target substrate may be eliminated.

Figure 3:
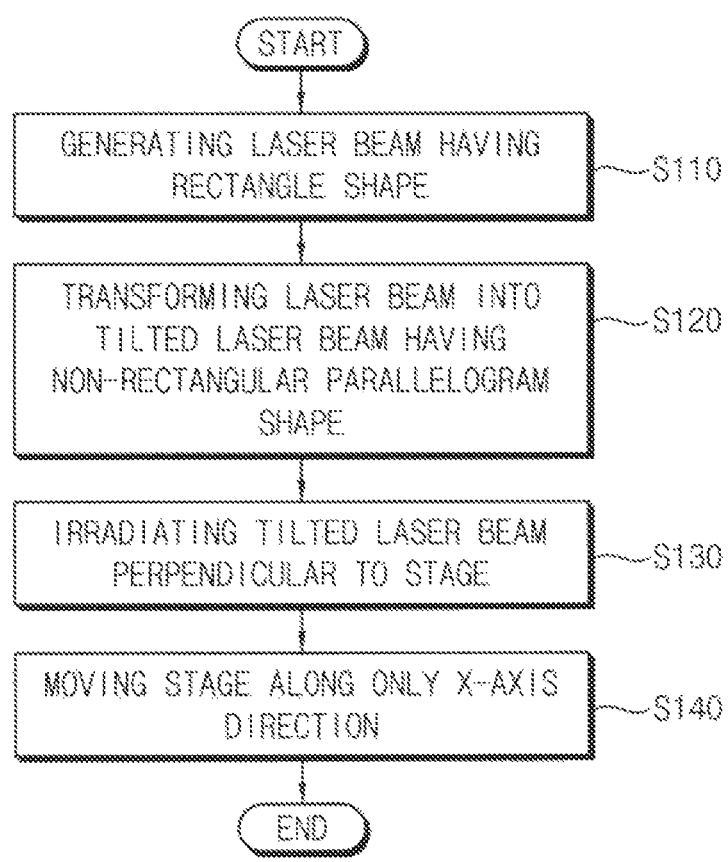
FIG. 3 is a flowchart illustrating a method of driving a laser crystallization apparatus according to an exemplary embodiment.
Figure 4:
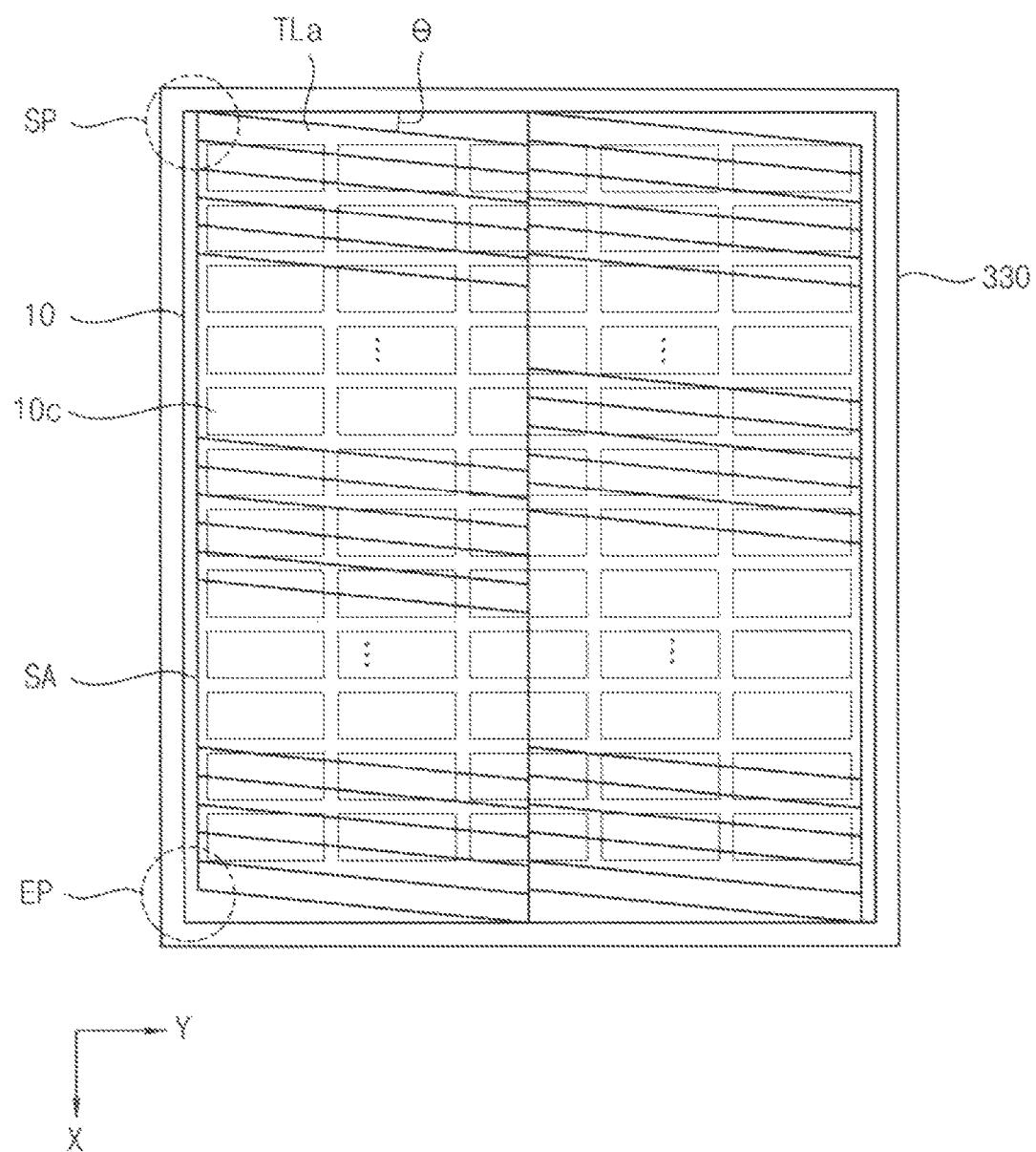
FIG. 4 is a conceptual diagram illustrating a method of driving a laser crystallization apparatus according to an exemplary embodiment.

FIG. 3 is a flowchart illustrating a method of driving a laser crystallization apparatus according to an exemplary embodiment. FIG. 4 is a conceptual diagram illustrating a method of driving a laser crystallization apparatus according to an exemplary embodiment.

Referring to FIGS. 2, 3 and 4, the laser generating module 100 is configured to generate a laser beam LA_O for crystallizing an amorphous silicon layer formed on the target substrate 10 into a polycrystalline silicon layer (operation S110). The laser beam LA_O may have a cross-sectional area of a rectangle shape, also called a rectangular shape. The optical module 200 is configured to guide a path of the laser beam LA_O through a first reflection mirror 210, a second reflection mirror 230 and a first window 250.

A second window 310 in the annealing chamber 300 may include a tilt refractive lens 400. The tilt refractive lens 400 is configured to transform the laser beam LA_O having a cross-sectional area of a rectangle shape into a tilted laser beam LA_T having a cross-sectional area of a non-rectangular parallelogram shape which has a longer-side tilted by a predetermined angle (Step S120).

The tilted laser beam LA_T may be irradiated perpendicular to a surface of the stage 330 (Step S130).

According to the exemplary embodiment, the tilted laser beam LA_T may have the cross-sectional area of a non-rectangular parallelogram shape which comprises a longer-side tilted by a predetermined angle θ with respect to the Y-axis and a shorter-side parallel with an X-axis. The predetermined angle θ may be an angle of about −1 degree. Alternatively, the predetermined angle θ may be variously preset according to process conditions.

The target substrate 10 having a target thin film which is an amorphous thin film is mounted on the surface of the stage 330.

The target substrate 10 may be a mother substrate including a plurality of display cells 10C. Each of the plurality of display cells 10C may be a display substrate for a display apparatus. For example, the display cell 10C may be a TFT array substrate for an LCD panel or an OLED panel.

The display cell 10C may include an amorphous silicon layer to be crystallized into polycrystalline silicon layer through crystallization processes.

The stage 330 is moved along only one direction, for example, the X-axis direction (Step S140).

The stage 330 is moved along only X-axis direction and thus, the tilted laser beam LA_T may sequentially scan the target substrate 10 along the X-axis direction. The target substrate 10 may have a shot area TLa in which the tilted laser beam LA_T is shot. The shot area may be same as the cross-sectional area of the tilted laser beam LA_T. The shot area of the target substrate may partially overlap with a previous shot area of the target substrate in which a tilted laser beam LA_T is previously shot.

The target substrate 10 may have a scan area SA scanned by the tilted laser beam LA_T. The scan area SA may have a first side edge being parallel with the X-axis and a second side edge being tilted with respect to the Y-axis. Thus, a space between the first side edge of the scan area SA and a first side edge of the target substrate 10 corresponding to the first side edge of the scan area SA may be the same from a beginning portion SP to an end portion EP of the scan area SA.

According to the exemplary embodiment, the stage 330 is moved along only X-axis direction and thus, a stage ripple which is defined by a velocity variance of the stage 330 while the stage 330 is moved, may be reduced.

In addition, the tilted laser beam having the cross-sectional area of the non-rectangular parallelogram shape is irradiated perpendicular to the target substrate and scans the target substrate along only X-axis direction. Thus, a space between side edges of the scan area and the target substrate corresponding to the X-axis direction may be the same from a beginning portion to an end portion of the scan area. Thus, a non-crystallization area in the target substrate may be eliminated.

Figure 5:
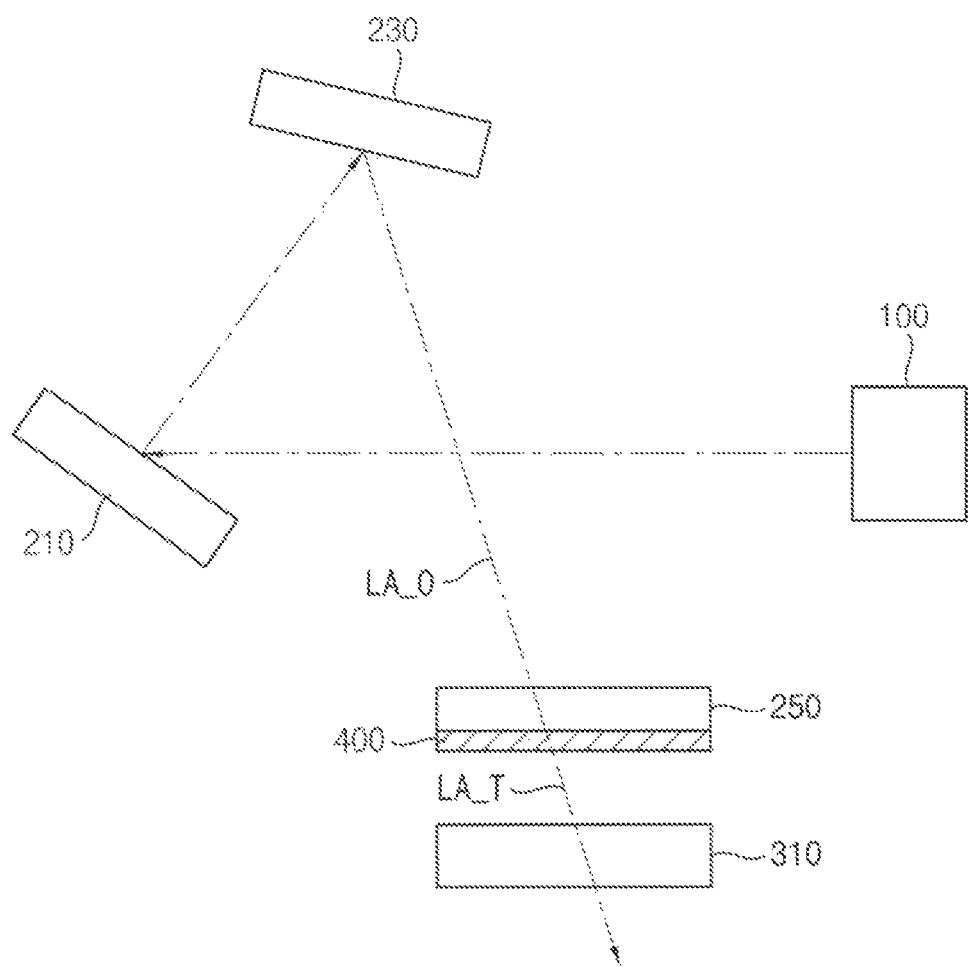
FIG. 5 is a block diagram illustrating a laser crystallization apparatus according to an exemplary embodiment.

FIG. 5 is a block diagram illustrating a laser crystallization apparatus according to an exemplary embodiment.

Referring to FIGS. 1 and 5, the laser crystallization apparatus may include a laser generating module 100, a first reflection mirror 210, a second reflection mirror 230, a first window 250 and a second window 310.

The laser generating module 100 is configured to generate a laser beam. The laser beam may be a pulsed laser. The laser beam LA_O generated from the laser generating module 100 may have a line shape and a cross-sectional area of the laser beam LA_O may have a rectangle shape.

The first reflection mirror 210 and the second reflection mirror 230 may be included in the optical module 200.

The first reflection mirror 210 is configured to reflect the laser beam LA_O toward the second reflection mirror 230. The first reflection mirror 210 may reflect at an exit angle larger than an incident angle of the laser beam LA_O.

The second reflection mirror 230 is configured to reflect the laser beam LA_O toward the annealing chamber 300.

The first window 250 may be disposed in the optical module 200. The laser beam LA_O generated from the optical module 200 may be transmitted toward the annealing chamber 300 through the first window 250.

Referring to FIG. 5, the first window 250 according to the exemplary embodiment may be coated with a material having a tilt refractive index or may have a tilt refractive lens 400 which is adhered to a film having the tilt refractive index. The tilt refractive lens 400 is configured to transform the laser beam LA_O having a cross-sectional area of a rectangle shape into a tilted laser beam LA_T having a cross-sectional area of a non-rectangular parallelogram shape which has a longer-side tilted by a predetermined angle.

For example, the tilt refractive lens 400 is configured to have enter the laser beam LA_O having the cross-sectional area of the rectangle shape which comprises a longer-side parallel with a Y-axis and a shorter-side parallel with an X-axis and is configured to have exit a tilted laser beam LA_T having the cross-sectional area of a non-rectangular parallelogram shape which comprises a longer-side tilted by a predetermined angle θ with respect to the Y-axis and a shorter-side parallel with an X-axis. The predetermined angle θ may be an angle of about −1 degree.

The second window 310 may be disposed in the annealing chamber 300. The tilted laser beam LA_T exited from the optical module 200 may be transmitted into the annealing chamber 300 through the second window 310.

The tilted laser beam LA_T may be irradiated perpendicular to a surface of the stage 330.

The stage 330 is moved along only X-axis direction and thus, the tilted laser beam LA_T may sequentially scan the target substrate 10 along the X-axis direction.

According to the exemplary embodiment, the stage 330 is moved along only X-axis direction and thus, a stage ripple which is defined by a velocity variance while the stage 330 is moved, may be reduced.

In addition, the tilted laser beam having the cross-sectional area of the non-rectangular parallelogram shape is irradiated perpendicular to the target substrate and scans on the target substrate along only X-axis direction. Thus, a space between side edges of the scan area and the target substrate corresponding to the X-axis direction may be the same from a beginning portion to an end portion of the scan area. Thus, a non-crystallization area in the target substrate may be eliminated.

Figure 6:
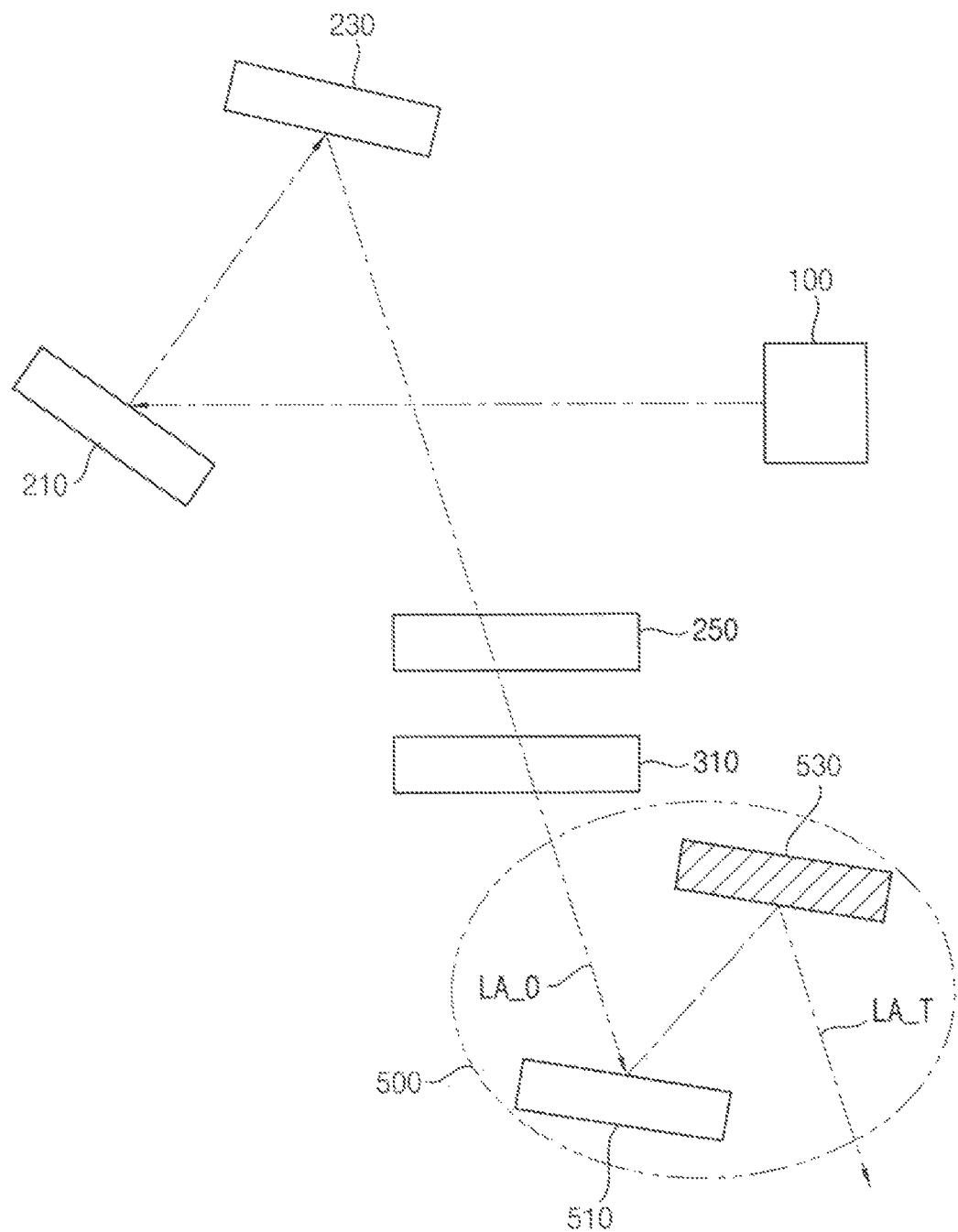
FIG. 6 is a block diagram illustrating a laser crystallization apparatus according to an exemplary embodiment.

FIG. 6 is a block diagram illustrating a laser crystallization apparatus according to an exemplary embodiment.

Referring to FIGS. 1 and 6, the laser crystallization apparatus may include a laser generating module 100, a first reflection mirror 210, a second reflection mirror 230, a first window 250, a second window 310 and a tilt refraction module 500.

The laser generating module 100 is configured to generate a laser beam. The laser beam may be a pulsed laser. The laser beam LA_O generated from the laser generating module 100 may have a line shape and a cross-sectional area of the laser beam LA_O may have a rectangle shape.

The first reflection mirror 210 and the second reflection mirror 230 may be included in the optical module 200.

The first reflection mirror 210 is configured to reflect the laser beam LA_O toward the second reflection mirror 230. The first reflection mirror 210 may reflect at an exit angle larger than an incident angle of the laser beam LA_O.

The second reflection mirror 230 is configured to reflect the laser beam LA_O toward the annealing chamber 300.

The first window 250 may be disposed in the optical module 200. The laser beam LA_O generated from the optical module 200 may be transmitted toward the annealing chamber 300 through the first window 250.

The second window 310 may be disposed in the annealing chamber 300. The laser beam LA_O exited from the optical module 200 may be transmitted into the annealing chamber 300 through the second window 310.

The tilt refraction module 500 may include a third reflection mirror 510 and a tilt refractive lens 530. The tilt refraction module 500 may be disposed in the annealing chamber 300.

The third reflection mirror 510 is configured to reflect the laser beam LA_O transmitted through the second window 310 toward the tilt refractive lens 530.

The tilt refractive lens 530 is configured to transform the laser beam LA_O having a cross-sectional area of a rectangle shape into a tilted laser beam LA_T having a cross-sectional area of a non-rectangular parallelogram shape which has a longer-side tilted by a predetermined angle.

Referring to FIG. 6, the tilt refractive lens 530 according to the exemplary embodiment may be configured to transform the laser beam LA_O having the cross-sectional area of the rectangle shape which includes a longer-side parallel with an Y-axis and a shorter-side parallel with an X-axis, into a tilted laser beam LA_T having the cross-sectional area of a non-rectangular parallelogram shape which includes a longer-side tilted by a predetermined angle θ with respect to the Y-axis and a shorter-side parallel with an X-axis.

The tilted laser beam LA_T may be irradiated perpendicular to a surface of the stage 330.

The stage 330 is moved along the X-axis direction and thus, the tilted laser beam LA_T may sequentially scan the target substrate 10 along the X-axis direction. According to the exemplary embodiment, the stage 330 is moved along only X-axis direction and thus, a stage ripple which is defined by a velocity variance while the stage 330 is moved, may be reduced.

In addition, the tilted laser beam having the cross-sectional area of the non-rectangular parallelogram shape is irradiated perpendicular to the target substrate and scans on the target substrate along only X-axis direction.

Thus, a space between side edges of the scan area and the target substrate corresponding to the X-axis direction may be the same from a beginning portion to an end portion of the scan area. Thus, a non-crystallization area in the target substrate may be eliminated.

Figure 7:
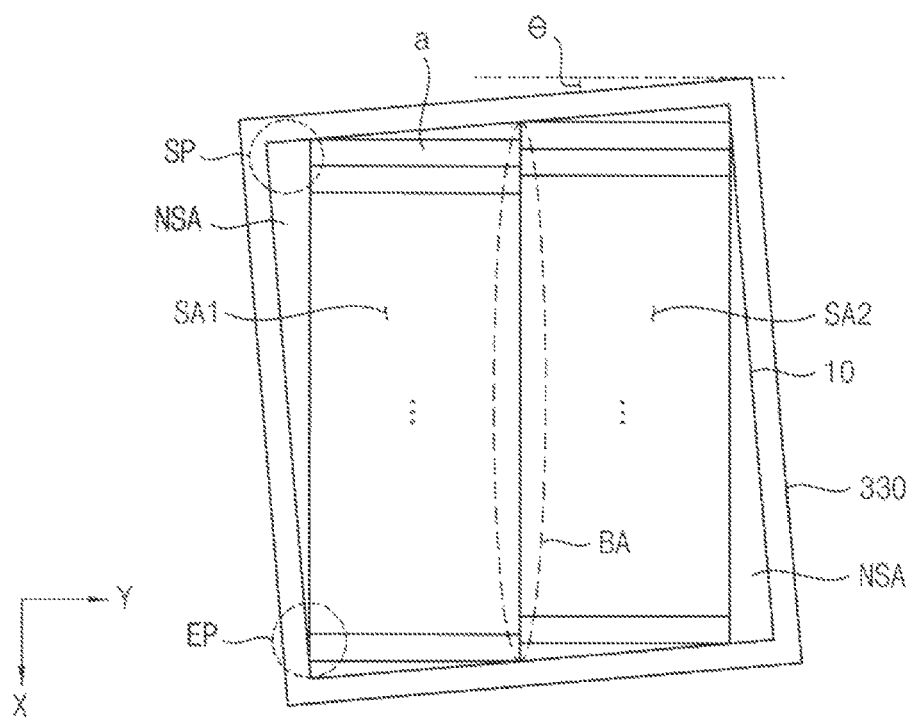
FIG. 7 is a conceptual diagram illustrating a method of driving a laser crystallization apparatus according to a first comparative example embodiment.

FIG. 7 is a conceptual diagram illustrating a method of driving a laser crystallization apparatus according to a first comparative example embodiment.

Referring to FIG. 7, a laser crystallization apparatus according to a first comparative example embodiment includes a tilted stage 330 which is tilted by a predetermined angle θ with respect to a Y-axis and is moved along an X-axis direction. A target substrate 10 is mounted on the tilted stage 330 and thus, the target substrate 10 is tilted by the predetermined angle θ with respect to the Y-axis in order to prevent a vertical line from being represented in a boundary area BA between a first scan area SA1 and a second scan area SA2 of the target substrate 10. The predetermined angle θ may be an angle of about −1 degree.

A laser beam according to the first comparative example embodiment has a cross-sectional area of a rectangle shape and is irradiated perpendicular to a surface of the stage 330.

A shot area 'a' of the target substrate 10 in which the laser beam is shot may correspond to the cross-sectional area of the laser beam. Thus, the shot area 'a' has a longer-side parallel with the Y-axis and a shorter-side parallel with the X-axis.

The tilted stage 330 is moved along the X-axis direction and thus, the laser beam sequentially scans target substrate 10 along the X-axis direction. The shot area 'a' of the target substrate 10 may partially overlap with a previous shot area in the target substrate 10 on which a laser beam is previously shot.

Thus, a space between side edges of the scan area SA and the target substrate 10 corresponding to the X-axis direction may be gradually changed from a beginning portion SP to an end portion EP of the scan area SA.

As shown in FIG. 7, a non-scan area NSA in which the laser beam is not irradiated is generated in both side areas of the target substrate 10 corresponding to the X-axis direction. In other words, the non-scan area NSA is the non-crystallization area.

According to the first comparative example embodiment, the titled stage 330 is moved along only X-axis direction and thus, a stage ripple may be reduced. However, the target substrate 10 may include the non-crystallization area corresponding to both side areas of the target substrate 10 and thus, crystallization defects may occur.

Figure 8:
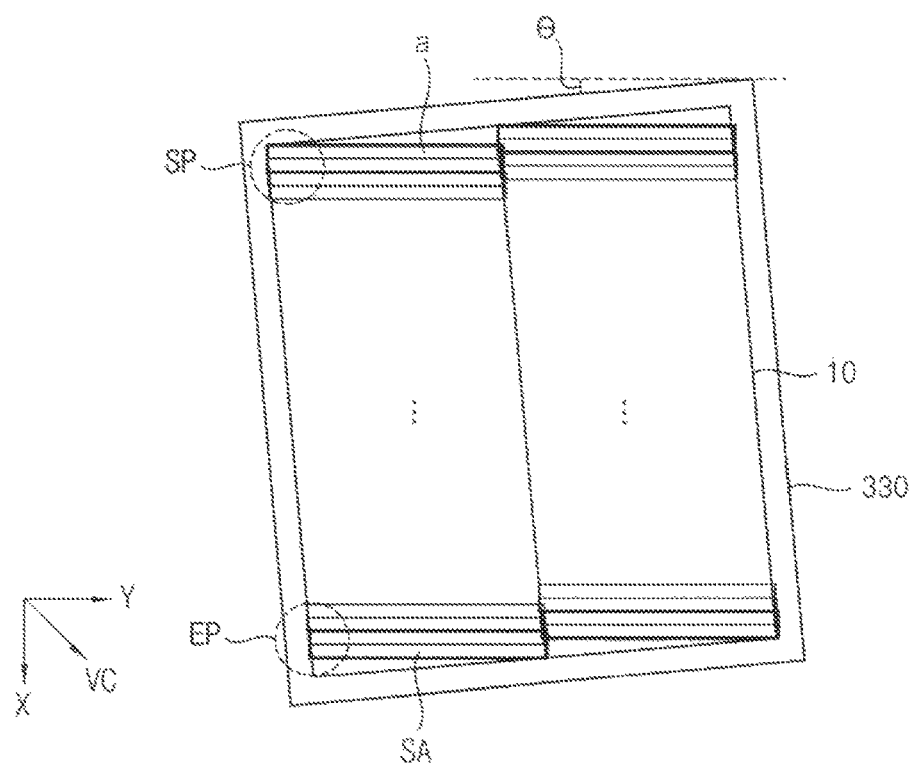
FIG. 8 is a conceptual diagram illustrating a method of driving a laser crystallization apparatus according to a second comparative example embodiment.

FIG. 8 is a conceptual diagram illustrating a method of driving a laser crystallization apparatus according to a second comparative example embodiment.

Referring to FIG. 8, the laser crystallization apparatus according to a second comparative example embodiment includes a tilted stage 330 which is tilted by a predetermined angle θ with respect to a Y-axis and is moved along a vector direction VC of an X-axis direction and an Y-axis direction. A target substrate 10 is mounted on the tilted stage 330 and thus, the target substrate 10 is tilted by the predetermined angle θ with respect to the Y-axis. The predetermined angle θ may be an angle of about −1 degree.

A laser beam according to the second comparative example has a cross-sectional area of a rectangle shape and is irradiated perpendicular to a surface of the stage 330.

A shot area 'a' of the target substrate 10 in which the laser beam is shot may correspond to the cross-sectional area of the laser beam. Thus, the shot area 'a' has a longer-side parallel with the Y-axis and a shorter-side parallel with the X-axis.

The tilted stage 330 is moved along the vector direction VC and thus, the laser beam sequentially scans target substrate 10 along the vector direction VC. The shot area 'a' of the target substrate 10 may partially overlap with a previous shot area of the target substrate 10 on which a laser beam is previously shot.

Thus, a space between side edges of the scan area SA and the target substrate 10 corresponding to the X-axis direction may be the same from a beginning portion SP to an end portion EP of the scan area SA.

According to the second comparative example embodiment, the non-scan area corresponding to both side areas of the target substrate 10 may not generated.

However, the titled stage 330 is moved along the Y-axis direction along with the X-axis direction to move along the vector direction VC and thus, a stage ripple may be increased.

Generally, when the stage is moved along the X-axis direction, the stage ripple increases by about ±0.86% to about ±1.63% with respect to a stopped state. In addition, when the stage is moved along the vector direction, the stage ripple increases by about ±2.11% with respect to the stopped state.

As described above, when the stage ripple increases, a movement of the stage may not be precisely controlled and thus the laser beam is non-uniformly irradiated. Therefore, display defects and crystallization defects occur by increase of the stage ripple.

The laser crystallization apparatus according the exemplary embodiment, the display defects and crystallization defects occurring by the first and second comparative example embodiments may be eliminated.

The laser crystallization apparatus according to the exemplary embodiment may irradiate the tilted laser beam having the cross-sectional area of a non-rectangular parallelogram shape which includes a longer-side tilted with respect to the Y-axis and a shorter-side parallel with the X-axis, perpendicular to a surface of the stage and then moves the stage along only X-axis direction without a tilt.

Therefore, the stage is moved along only X-axis direction and thus, the stage ripple may be reduced with respect to the second comparative example embodiment.

In addition, the tilted laser beam having the cross-sectional area of the non-rectangular parallelogram shape is irradiated perpendicular to the target substrate and thus, a space between side edges of the scan area and the target substrate corresponding to each other may be the same from a beginning portion to an end portion of the scan area. Thus, a non-crystallization area in the target substrate may be eliminated such as the second comparative example embodiment.

Figure 9:
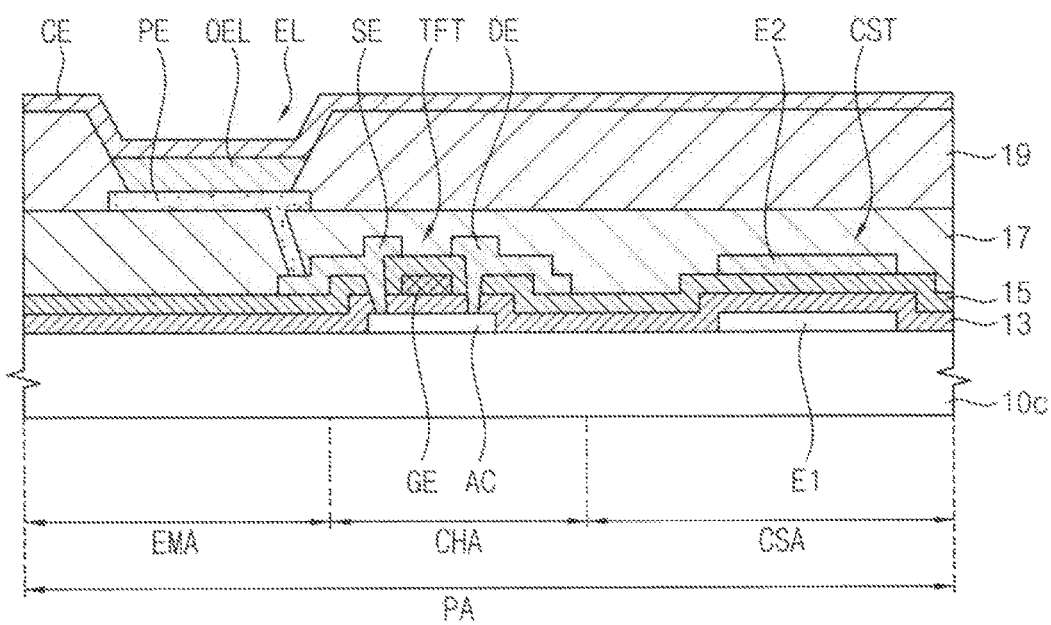
FIG. 9 is a cross-sectional view illustrating a TFT array substrate manufactured by a laser crystallization apparatus according to an exemplary embodiment.

FIG. 9 is a cross-sectional view illustrating a TFT array substrate manufactured by a laser crystallization apparatus according to an exemplary embodiment.

Referring to FIG. 9, the TFT array substrate may be a TFT array substrate 10c, sometimes called a display cell 10c, for an OLED panel. The TFT array substrate 10c for the OLED panel may be formed using the crystallization processes using the laser crystallization apparatus according to the exemplary embodiment.

The TFT array substrate 10c may include a plurality of pixels. Each of the plurality of pixels may include a thin film transistor TFT, an organic light emitting element EL and a storage capacitor CST.

A pixel area PA in which a pixel is formed includes a channel area CHA, a capacitor area CSA and a light emitting area EMA. The thin film transistor TFT may be formed in the channel area CHA. The thin film transistor TFT includes an active layer AC, a gate electrode GE, a source electrode SE and a drain electrode DE. A first insulating layer 13 is formed between the gate electrode GE and the active layer AC. In addition, a source area and a drain source area in which dopants of a high concentration are doped, are formed in both side areas of the active layer AC. The source and drain electrodes SE and DE are connected to the source and drain areas, respectively.

A second insulating layer 15 is formed between the gate electrode GE and the source/drain electrodes SE and DE.

The storage capacitor CST is formed in the capacitor area CSA. The storage capacitor CST includes a first electrode E1, a second electrode E2 and the first and second insulating layers 13, 15 between the first and second electrodes E1 and E2. The first electrode E1 may be formed from the same layer as the active layer AC. The second electrode E2 may be formed from the same layer as the source/drain electrodes SE and DE.

The organic light emitting element EL is formed in the light emitting area EMA. The organic light emitting element EL includes a pixel electrode PE connected to one of the source and drain electrodes SE and DE, a common electrode CE opposite to the pixel electrode PE and an organic light emitting layer OEL disposed between the pixel electrode PE and the common electrode CE. A third insulating layer 17 is formed between the source/drain electrodes SE and DE and the pixel electrode PE. A pixel definition layer 19 is formed on the pixel electrode PE. The pixel definition layer 19 includes an opening through which the pixel electrode PE is exposed. The organic light emitting layer OEL is formed in the opening.

The active layer AC of the thin film transistor and the first electrode E1 of the storage capacitor CST may include a polycrystalline silicon layer which is crystallized by the laser crystallization apparatus according to the exemplary embodiment. Generally, an amorphous silicon layer may be formed on a buffer layer of an insulating layer which is formed on a substrate and then, the amorphous silicon layer may be crystallized into the polycrystalline silicon layer.

The crystallization processes by the laser crystallization apparatus according to the exemplary embodiment, include irradiating the tilted laser beam having the cross-sectional area of a non-rectangular parallelogram shape perpendicular to a surface of the stage and moving along only one direction without a tilt.

Therefore, the stage is moved along only X-axis direction and thus, the stage ripple may be reduced. In addition, the tilted laser beam having the cross-sectional area of the non-rectangular parallelogram shape is irradiated perpendicular to the target substrate and thus, a space between side edges of the scan area and the target substrate corresponding to each other may be the same from a beginning portion to an end portion of the scan area. Thus, a non-crystallization area in the target substrate may be eliminated.

The present inventive concept may be applied to any display device, e.g., an organic light emitting display device, a liquid crystal display device, etc. For example, the present inventive concept may be applied to a television, a computer monitor, a laptop, a digital camera, a cellular phone, a smart phone, a personal digital assistant (PDA), a portable multimedia player (PMP), an MP3 player, a navigation system, a video phone, etc.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A laser crystallization apparatus comprising:
    a laser generating module configured to generate a laser beam;
    an optical module configured to guide the laser beam;
    an annealing chamber comprising a stage on which a target substrate comprising an amorphous thin film formed therein is disposed, the stage being movable along an X-axis direction and a Y-axis direction; and
    a tilt refractive lens configured to transform the laser beam having a cross-sectional area of a rectangle shape into a tilted laser beam having a cross-sectional area of a non-rectangular parallelogram shape and to irradiate the tilted laser beam perpendicular to the stage, wherein the cross-sectional area of the tilted laser beam comprises the non-rectangular parallelogram shape which has a first side being parallel with the X-axis and a second side tilted with respect to the Y-axis.

2. The laser crystallization apparatus of claim 1, wherein the stage moves along only the X-axis direction.

3. The laser crystallization apparatus of claim 2, wherein the first side of the non-rectangular parallelogram shape is a shorter-side being parallel with the X-axis and the second side of the non-rectangular parallelogram shape is a tilted longer-side tilted with respect to the Y-axis.

4. The laser crystallization apparatus of claim 3, wherein the optical module comprises:
    a plurality of reflection mirrors configured to reflect the laser beam toward the annealing chamber; and
    a first window configured to transmit the laser beam reflected from the reflection mirrors toward the annealing chamber, wherein the first window comprises the tilt refractive lens.

5. The laser crystallization apparatus of claim 3, wherein the annealing chamber comprises:
    a second window configured to transmit the laser beam exited from the optical module toward the stage, wherein the second window comprises the tilt refractive lens.

6. The laser crystallization apparatus of claim 3, wherein the annealing chamber comprises:
    a second window configured to transmit the laser beam exited from the optical module; and
    a reflection mirror configured to reflect the laser beam incident through the second window toward the tilt refractive lens.

7. The laser crystallization apparatus of claim 3, wherein a shot area of the target substrate in which the tilted laser beam is shot, partially overlaps with a previous shot area of the target substrate on which a tilted laser beam is previously shot.

8. The laser crystallization apparatus of claim 3, wherein a scan area of the target substrate in which the tilted laser beam scans comprises a first side edge being parallel with the X-axis and a second side edge being tilted with respect to the Y-axis.

9. The laser crystallization apparatus of claim 8, the scan area has a non-rectangular parallelogram shape which is tilted with respect to the Y-axis.

10. The laser crystallization apparatus of claim 1, wherein the laser beam is a pulsed laser.

11. The laser crystallization apparatus of claim 1, wherein the target substrate comprises a TFT array substrate for a display apparatus.

12. A method of driving a laser crystallization apparatus comprises:
    generating a laser beam;
    transforming the laser beam having a cross-sectional area of a rectangle shape into a tilted laser beam having a cross-sectional area of a non-rectangular parallelogram shape; and
    irradiating the tilted laser beam perpendicular to a target substrate which comprises an amorphous thin film formed therein and is disposed on a stage, wherein the cross-sectional area of the tilted laser beam comprises the non-rectangular parallelogram shape which has a first side being parallel with an X-axis and a second side tilted with respect to a Y-axis.

13. The method of claim 12, wherein the stage moves along only the X-axis direction.

14. The method of claim 13, wherein the first side of the non-rectangular parallelogram shape is a shorter-side being parallel with the X-axis and the second side of the non-rectangular parallelogram shape is a tilted longer-side tilted with respect to the Y-axis.

15. The method of claim 14, wherein the cross-sectional area of the tilted laser beam comprises a longer-side tilted by an angle of −1 degree with respect to the Y-axis.

16. The method of claim 14, wherein a shot area of the target substrate in which the tilted laser beam is shot, partially overlaps with a previous shot area of the target substrate on which the tilted laser beam is previously shot.

17. The method of claim 14, wherein a scan area of the target substrate in which the tilted laser beam scans the target substrate comprises a first side edge being parallel with the X-axis and a second side edge being tilted with respect to the Y-axis.

18. The method of claim 14, wherein the scan area has a non-rectangular parallelogram shape which is tilted with respect to the Y-axis.

19. The method of claim 12, wherein the target substrate comprises a TFT array substrate for a display apparatus.

20. The method of claim 12, wherein the laser beam is a pulsed laser.

* * * * *